US008761955B2

(12) United States Patent
Saigo et al.

(10) Patent No.: US 8,761,955 B2
(45) Date of Patent: Jun. 24, 2014

(54) MANAGEMENT COMPUTER, COMPUTER SYSTEM INCLUDING THE SAME, AND METHOD FOR PROVIDING ALLOCATING PLAN FOR IT EQUIPMENT

(75) Inventors: Kiyokazu Saigo, Yokohama (JP); Jun Okitsu, Kokubunji (JP); Hayato Shimizu, Kasumigaura (JP)

(73) Assignee: Hitachi, Ltd., Tokyo (JP)

( * ) Notice: Subject to any disclaimer, the term of this patent is extended or adjusted under 35 U.S.C. 154(b) by 206 days.

(21) Appl. No.: 13/128,801

(22) PCT Filed: Apr. 27, 2011

(86) PCT No.: PCT/JP2011/002465
§ 371 (c)(1), (2), (4) Date: May 11, 2011

(87) PCT Pub. No.: WO2012/147131
PCT Pub. Date: Nov. 1, 2012

(65) Prior Publication Data

US 2012/0278045 A1 Nov. 1, 2012

(51) Int. Cl.
*G05D 23/00* (2006.01)
*G06F 15/17* (2006.01)

(52) U.S. Cl.
USPC .......................................... 700/300; 709/226

(58) Field of Classification Search
None
See application file for complete search history.

(56) References Cited

U.S. PATENT DOCUMENTS

2009/0254660 A1* 10/2009 Hanson et al. ................ 709/226
2009/0259345 A1* 10/2009 Kato et al. .................... 700/295
2009/0327778 A1 12/2009 Shiga et al.
2010/0106988 A1 4/2010 Hayashi et al.
2010/0217454 A1* 8/2010 Spiers et al. ................. 700/300
2011/0060561 A1* 3/2011 Lugo et al. ........................ 703/1
2011/0113273 A1 5/2011 Okitsu et al.
2011/0126206 A1 5/2011 Kato et al.

FOREIGN PATENT DOCUMENTS

JP 2009-252056 A 10/2009
JP 2010-015192 A 1/2010
JP 2010-108115 A 5/2010
JP 2011-008822 A 1/2011
JP 2011-034578 A 2/2011
JP 2011-040083 A 2/2011
WO 2008/144375 A2 11/2008
WO 2009/154623 A1 12/2009
WO 2010032501 A1 3/2010
WO 2010050249 A1 5/2010

OTHER PUBLICATIONS

Cho et al, Measurements and predictions of the air distribution systems in high compute density (Internet) data centers, Energy and Buildings, 2009, pp. 1107-1115, vol. 41, Elsevier.

* cited by examiner

*Primary Examiner* — Sean Shechtman
(74) *Attorney, Agent, or Firm* — Volpe and Koenig, P.C.

(57) ABSTRACT

There are a large number of operation workload reallocating plans, but in terms of a required calculation resource, it is undesirable to, in each case, derive power consumption required for a cooling apparatus, select and control operation workload deployment for minimizing a total value of the derived power consumption and server power. The present invention derives a rule about the IT workload allocation in advance from configuration information (static information) including position information of facilities including an air conditioner of the data center and the IT equipment items, changes priority of an applied rule on the basis of dynamic information including ambient temperature, and changes the IT workload allocation, thereby reducing the power consumption of the air conditioner.

9 Claims, 15 Drawing Sheets

301 302 303 300

| Equipment ID | Position information | Machine model information |
|---|---|---|
| Physical server 01 | In rack 01 [1/40] | HServer_A |
| Physical server 02 | In rack 01 [2/40] | HServer_A |
| Physical server 03 | In rack 02 [1/40, 2/40] | HServer_A |
| ... | ... | ... |

| Frame ID (401) | Position information (402) | Frame information (403) |
|---|---|---|
| Rack 01 | Room01 (1, 1, 0) | HRack_A |
| Rack 02 | Room01 (1, 2, 0) | HRack_A |
| ... | ... | ... |

| Frame information (403) | Size information (502) |
|---|---|
| HRack_A | (1, 1, 2) |
| ... | ... |

| Machine model information (303) | Inlet (602) | | | Outlet (603) | | | Heat generation amount (604) |
|---|---|---|---|---|---|---|---|
| | Allocate | Direction | Air volume | Allocate | Direction | Air volume | |
| HServer_A | Front surface | Horizontal | f1 | Back surface | Horizontal | f1 | q1 |
| ... | ... | ... | ... | ... | ... | ... | |

| Facility ID | Air supply and air return port ID | Facility specification information |
|---|---|---|
| Air conditioner 01 | Air supply port 01<br>Air supply port 02<br>Air return port 01 | HAC_A |
| ... | ... | ... |

| Air supply and air return port ID | Position information | Size | Direction |
|---|---|---|---|
| Air supply 01 | Room01 (2, 1, 0) | ( 0.5, 0.5, 0) | (0, 0, 1) |
| Air supply 02 | Room01 (2, 2, 0) | ( 0.5, 0.5, 0) | (0, 0, 1) |
| Air return port 01 | Room01 (2, 10, 2) | ( 1, 0, 0.5) | (0, 1, 0) |
| ... | ... | ... | |

803 1002 1003 1000

| Facility specification information | Air conditioning characteristic information | Feature |
|---|---|---|
| HAC_A | W1 = F1(Q) | External air conditioner |
| HAC_B | W2 = F2(Q) | Rack-type air conditioner |
| ... | ... | ... |

| State ID (1301) | State contents (1302) |
|---|---|
| I_001 | Enthalpy of the external air E: E < E1 |
| I_002 | Enthalpy of the external air E: E1 <= E < E2 |
| I_003 | Enthalpy of the external air E: E2 <= E |
| I_004 | Absolute humidity of external air H: H < H1 |
| I_005 | Absolute humidity of external air H: H1 <= H |
| ... | ... |

| Rule ID (1401) | Condition (1402) | Recommended VM movement rule (1403) |
|---|---|---|
| R_001 | I_001 and I_004 | Aggregate IT workload around air supply port of external air conditioner |
| R_002 | I_003 and I_005 | Aggregate IT workload around air supply port of rack-type air conditioner |
| R_003 | ... | Aggregate in lower spaces (30/40 to 40/40) of rack 01 and rack 02 |
| R_004 | ... | Aggregate in rack 01 |
| ... | ... | ... |

| Sensor ID | Position information | Sensor information | Sensor type |
|---|---|---|---|
| Sensor 01 | (x1, y1, z1) | t1 | Temperature |
| Sensor 02 | (x2, y2, z2) | h1 | Humidity |
| Sensor 03 | (x3, y3, z3) | e1 | Enthalpy |
| Sensor 04 | (x4, y4, z4) | f1 | Air volume |
| ... | ... | ... | ... |

| System ID (1601) | Virtualized information (1602) | Operation equipment information (1603) | Movability (1604) | Resource size (1605) | | |
|---|---|---|---|---|---|---|
| | | | | Memory | CPU | Disk |
| System01 | Virtual | Physical server 01 | Movable | m1 | c1 | d1 |
| System02 | Virtual | Physical server 01 | Movable | m2 | c2 | d2 |
| System03 | Virtual | Physical server 01 | Movable | m3 | c3 | d3 |
| System04 | Virtual | Physical server 02 | Movable | m4 | c4 | d4 |
| ... | ... | ... | ... | ... | ... | ... |

123

1701 1702

| Equipment and facility ID | Power supply information |
| --- | --- |
| Physical server 01 | ON |
| Physical server 02 | ON |
| Physical server 03 | OFF |
| Air conditioner 01 | ON |
| ... | ... |

MANAGEMENT COMPUTER, COMPUTER SYSTEM INCLUDING THE SAME, AND METHOD FOR PROVIDING ALLOCATING PLAN FOR IT EQUIPMENT

TECHNICAL FIELD

The present invention relates to a management computer, a computer system including the management computer, and a method for providing an allocating plan of information technology (IT) equipment items. More specifically, the present invention relates to a technology for providing an allocating plan for IT equipment items in a data center.

BACKGROUND ART

In recent years, there has been a growing challenge to control increase in power consumption in a data center. For example, Patent Document 1 discloses a technology about a power saving controller for determining operational deployment to reduce power consumption of an overall system in a data center.

CITATION LIST

Patent Literature

PTL 1: JP Patent Publication (Kokai) No. 2010-015192A

SUMMARY OF INVENTION

Technical Problem

However, there are a large number of operation workload reallocating plans, but in terms of a required calculation amount (workload x time), it is undesirable to, in each case, derive power consumption required for a cooling apparatus, select and control operation workload deployment for minimizing a total value of the derived power consumption and server power. Namely, because strict calculation (simulation) of required power consumption is extremely time-consuming, it is inefficient to calculate power consumption in accordance with a slight change in IT equipment deployment. Even if IT equipment deployment which achieves maximum possible reduction in the power consumption can be obtained, a resultant enormous calculation amount to achieve this is more undesirable. Therefore, it is required to balance two objects of power consumption reduction and calculation amount reduction.

The present invention has been made in view of such circumstances, and an object of the invention is to provide a technology for achieving moderate reduction of a total amount of the power consumption of the managed server having IT workload and a cooling apparatus without extremely increasing calculation cost as well as with balancing a calculation amount and the power reduction effect.

Solution to Problem

In order to solve the above-described problems, the present invention derives a rule about the IT workload allocation in advance from configuration information (static information) including position information of facilities including an air conditioner of the data center and the IT equipment items, changes priority of an applied rule on the basis of dynamic information including ambient temperature, and changes the IT workload allocation, thereby reducing the power consumption of the air conditioner.

That is, in the present invention, the management computer (management server) creates a vector field showing an air flow in a data center where a heat amount of the IT equipment items is a predetermined value on the basis of position information of the multiple IT equipment items and the air conditioning facilities in the data center, equipment configuration information showing a configuration to cool the IT equipment items in the multiple IT equipment items, and facility configuration information including air conditioning characteristic information in at least one of the air conditioning facilities. In addition, in accordance with the vector field, the management computer creates an allocation rule indicating multiple allocation patterns for the multiple IT equipment items in the data center where the power consumption of the air conditioning facilities is lower than the present power consumption, thereby presenting an allocating plan for the IT equipment items based on the allocation rule. In addition, the management computer obtains environmental information including an air state outside the server center, a return air state in the server center, and a heat generation amount of the IT equipment items, and then compares the environmental information with the allocation patterns included in the allocation rule to derive and present an allocating plan to be recommended. At this time, a user interface may be displayed on the display screen, the user interface comparing evaluation of the power consumption amount and an energy-saving degree where the allocating plan to be recommended is selected with evaluation of the power consumption amount and an energy-saving degree where the present deployment is used, thereby allowing an administrator to select one of the allocating plans.

Further characteristics related to the present invention will be apparent from the description of the specification and the accompanying drawings. In addition, aspects of the present invention are accomplished and achieved by an element, a combination of various elements, the following detailed description, and appended Claims.

The description of the specification is only a representative example and it should be appreciated that the description herein does not limit the scope of the Claims and applications of the present invention in any way.

Advantageous Effects of Invention

The present invention allows for efficient determination of IT equipment operational deployment which reduces power consumption of an overall system.

BRIEF DESCRIPTION OF DRAWINGS

FIG. 4 is a diagram illustrating frame position information 400 configuring a part of the equipment position and configuration information.

FIG. 5 is a diagram illustrating frame specification information 500 for complementing the frame position information 400 configuring a part of the equipment position and configuration information 111.

FIG. 6 is a diagram illustrating information showing hardware specifications of IT equipment items corresponding to machine model information 303.

FIG. 13 is a diagram illustrating a configuration example of environmental state information 1300 used to create an allocation'rule 113.

FIG. 14 is a diagram illustrating an example of the created allocation rule 113.

FIG. 15 is a diagram illustrating a detailed example of sensor information 121.

FIG. 16 is a diagram illustrating a configuration example of system configuration information 122.

DESCRIPTION OF EMBODIMENTS

Hereinafter, embodiments of the present invention will be described with reference to the accompanying drawings. In the accompanying drawings, elements having a same function may be denoted by a same number. It should be noted that the accompanying drawings illustrate specific embodiments and implementations according to the principle of the present invention, but they are for illustrating the present invention and should not be construed as limiting the present invention in any way.

In the embodiments, the description is made in detail so that those skilled in the art can implement the present invention. However, it should be appreciated that another implementation or form may also be practiced, and modification in configuration and construction or replacement of various elements can be made without departing from the scope and spirit of the technical idea of the present invention. Therefore, the following description should not be construed as limitation.

Furthermore, as described later, the embodiments of the present invention may be implemented in software which runs on a general purpose computer as well as may also be implemented in dedicated hardware or a combination of software and hardware.

It should be noted that each item of information of the present invention will be described with a "table" form in the following description. However, these information items may not necessarily be represented by a table of data structure. They may also be represented by a list, a DB, a queue, or the like of data structure. Thus, "table," "list," "DB," "queue" or the like is sometimes simply referred to as "information" for representing that the information items do not depend on data structure.

Also, in order to explain contents of each item of the information, the expressions "identification information," an "identifier," a "name," "appellation," and an "ID" may be used and they can be replaced with each other.

Hereinafter, each piece of the processing in the embodiments of the present invention will be described with the "program" as a subject (agent of action). However, because the program performs the determined processing by a processor executing the program using a memory and a communication port (communication controller), the processor may be a subject in the description. In addition, the processing disclosed with the program as the subject may be performed by a computer and an information processing device such as a management server. A part of the program or the entire program may be achieved by dedicated hardware or may be modularized. A variety of programs may be installed in each computer using a program distribution server or a storage medium.

(1) First Embodiment

<Configuration of IT Equipment Management System>

Figure 1:
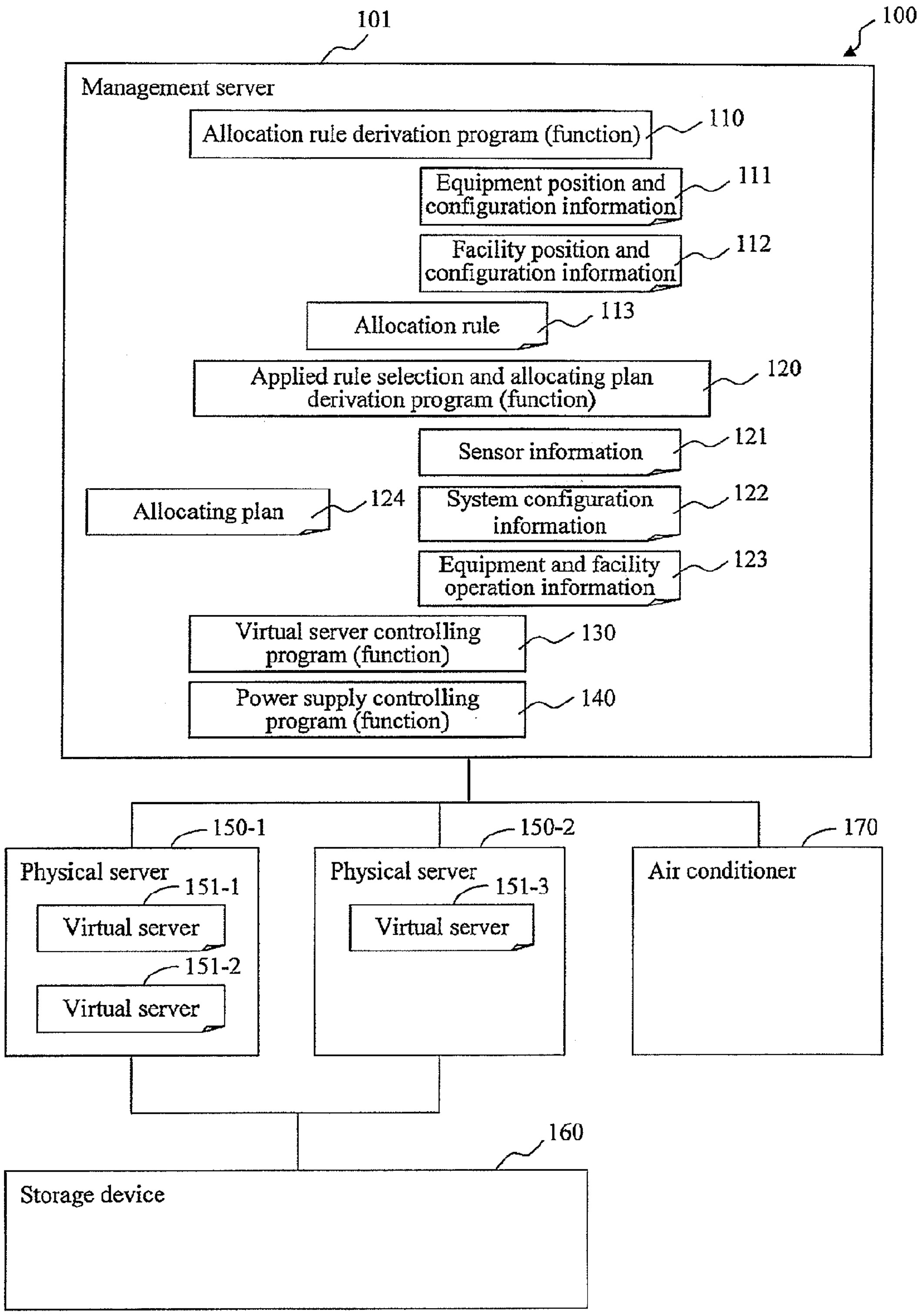
FIG. 1 is a diagram illustrating a schematic configuration of a computer system according to an embodiment of the present invention.

FIG. 1 is a diagram illustrating a schematic configuration of an IT equipment management system (also referred to as a computer system) 100 installed in a data center according to an embodiment of the present invention.

The IT equipment management system 100 includes at least one management server (also referred to as a management computer) 101, one or more physical servers 150-1 to 150-2, one or more storage devices 160, and one or more air conditioners 170, and they are connected to each other via a network. In addition, one or more virtual servers 151-1, 151-2, and 151-3 are operating on the physical servers 150-1 to 150-2.

The management server 101 includes, in its memory (see FIG. 2), an allocation rule derivation program (also referred to as an allocation rule derivation function) 110, equipment position and configuration information 111, facility position and configuration information 112, an allocation rule 113 created by the allocation rule derivation program 110, an applied rule selection and allocating plan derivation program (also referred to as an applied rule selection and allocating plan derivation function) 120, sensor information 121 on a sensor positioned in the data center, the information including information on ambient temperature and the like, system configuration information 122 including a correspondence relationship between a virtual server and a physical server, equipment and facility operation information 123 including power supply on and off information, an allocating plan 124 derived from the applied rule selection and allocating plan derivation program 120, a virtual server controlling program (also referred to as a virtual server controlling function) 130 for creating, moving, and managing the virtual server in the physical server, and a power supply controlling program (also referred to as a power supply controlling function) 140 for controlling and managing a power supply in the system.

Figure 12:
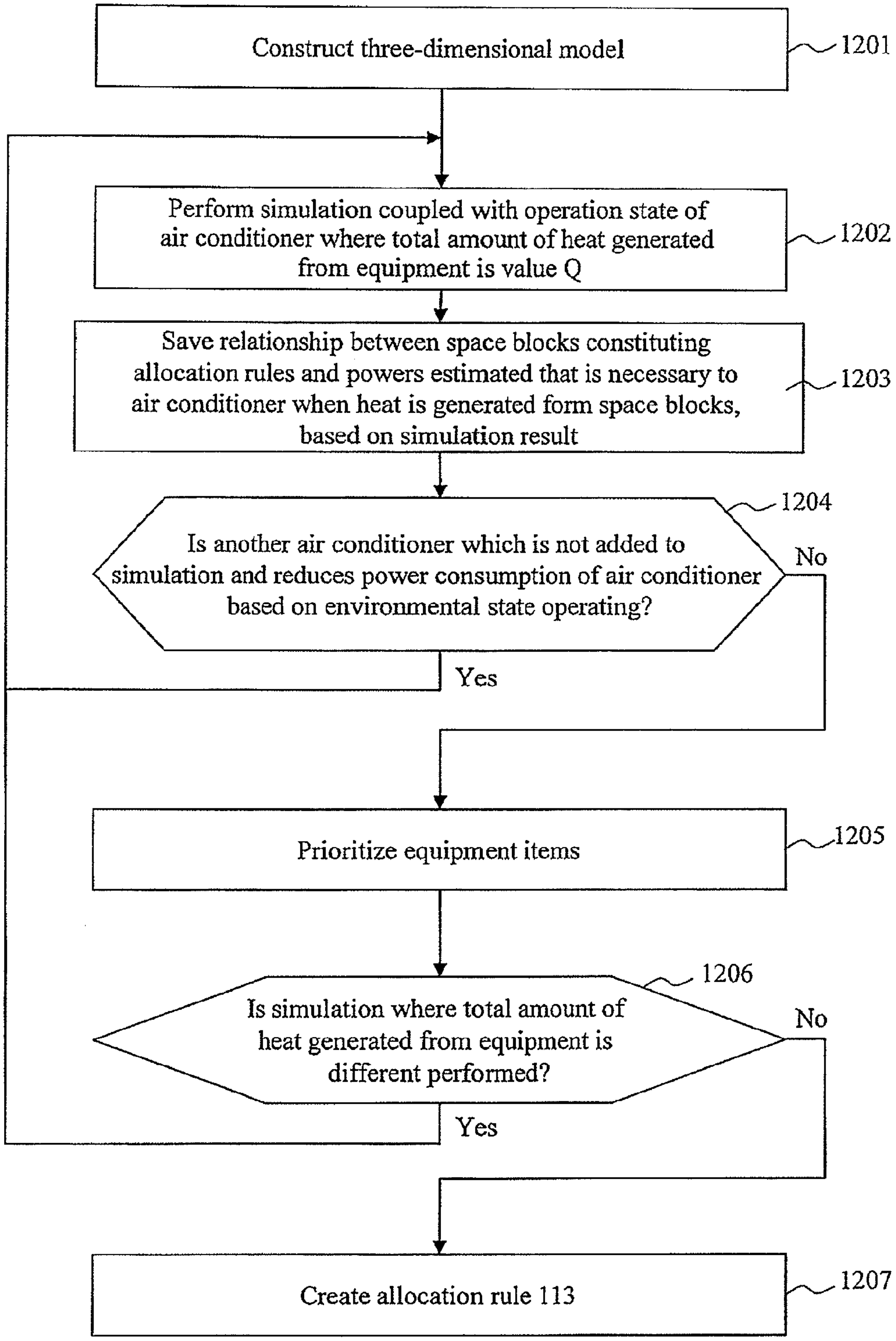
FIG. 12 is a flow chart for illustrating processing of an allocation rule derivation program 110.

The allocation rule derivation program 110 derives the allocation rules 113 including a priority order of the physical servers 150-1 to 150-2 on which the virtual servers operate and a condition to apply the priority order so as to reduce the power consumption of the entire system. An example of the allocation rules 113 is illustrated in FIG. 12. To derive the allocation rules 113, the allocation rule derivation program 110 uses the equipment position and configuration information 111 including position information of the equipment and the facility position and configuration information 112 including position information of the air conditioner.

The applied rule selection and allocating plan derivation program 120 uses the sensor information 121, the system configuration information 122, and the equipment and facility operation information 123 to select a rule applied to the virtual server deployment from the allocation rules 113, thereby deriving the virtual server allocating plan 124.

The virtual server controlling program 130 moves and allocates the virtual server into the physical server on the basis of the system configuration information 122 and the allocating plan 124.

The power supply controlling program 140 controls turning the power supply on and off on the basis of the system configuration information 122 and the allocating plan 124.

<Internal Schematic Configuration of Each Computer>

Figures 2, 3:
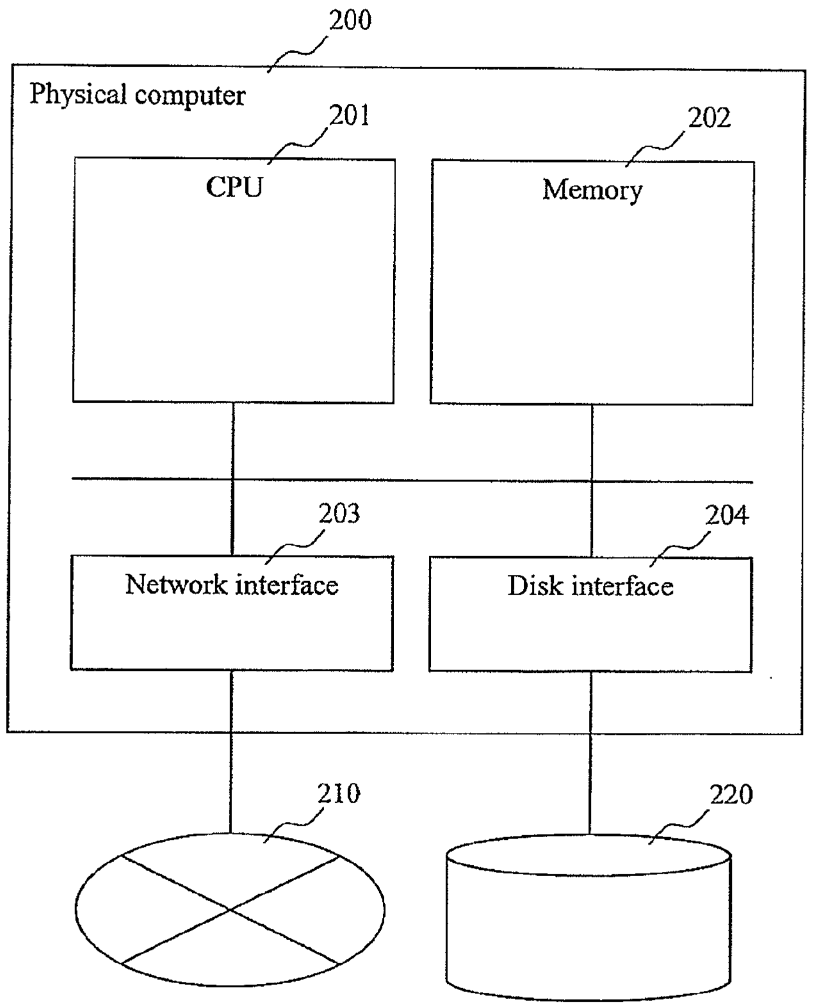
FIG. 2 is a diagram illustrating a schematic configuration of a hardware of each physical computer (such as a management server and a physical server) composing the computer system.
FIG. 3 is a diagram illustrating equipment position information 300 configuring a part of equipment position and configuration information 111.

FIG. 2 is a diagram illustrating an internal hardware schematic configuration of a physical computer 200 composing managed physical servers 150-1 to 150-2, the management server 101, and the like. Namely, the management server 101 and the physical servers 150-1 to 150-2 have the configuration of typical computers. It should be noted that the storage device 160 also has the configuration of the typical computers. However, unlike the physical servers and the management server, the storage device 160 has a disk controller and at least one disk device. A storage area of the disk device composes a logic volume and a pool area.

The physical computer 200 includes a CPU 201, a memory 202, a network interface 203, and a disk interface 204. A variety of programs are typically stored in a disk device 220. The programs are loaded into the memory 202 and then executed by the CPU 201. The network interface 203 is used in communication via a network 210.

<Detail of Equipment Position and Configuration Information>

FIGS. 3 to 6 are diagrams illustrating details of the equipment position and configuration information 111. Hereinafter, each of them will be described. Referring to information of FIGS. 3 to 6, a three-dimensional deployment image of the IT equipment items (e.g., a physical server and a storage device) can be created.

(i) Equipment Position Information

FIG. 3 is a diagram illustrating the equipment position information 300 configuring a part of the equipment position and configuration information 111. The physical server position information 300 includes an equipment ID 301, position information 302, and machine model information 303 as configuration information.

The equipment ID 301 is information for identifying an IT equipment item. Each of the equipment items is uniquely identified by the equipment ID. The position information 302 is information for representing a place in which the IT equipment is installed. The position information 302 may be represented by using a frame such as a rack and a chassis, in which equipment is stored, as well as may also be represented by using three-dimensional coordinate information. The machine model information 303 is information for identifying specifications of the IT equipment items. For example, the information may be a model number of the equipment. In addition to a model number, if the equipment has a hardware specification which can be partially selected, it may be attached to the machine model information 303.

If the position information 302 is represented by a frame such as a rack and a chassis, position information of the frame is managed by using frame position information shown in a table 400 of FIG. 4. The description of FIG. 4 will be described later.

The machine model information 303 includes inlet information and outlet information of the equipment in a table 600 of FIG. 6 and a hardware specification of the IT equipment is managed by these information items. FIG. 6 will be described later.

Figures 7, 8, 9:
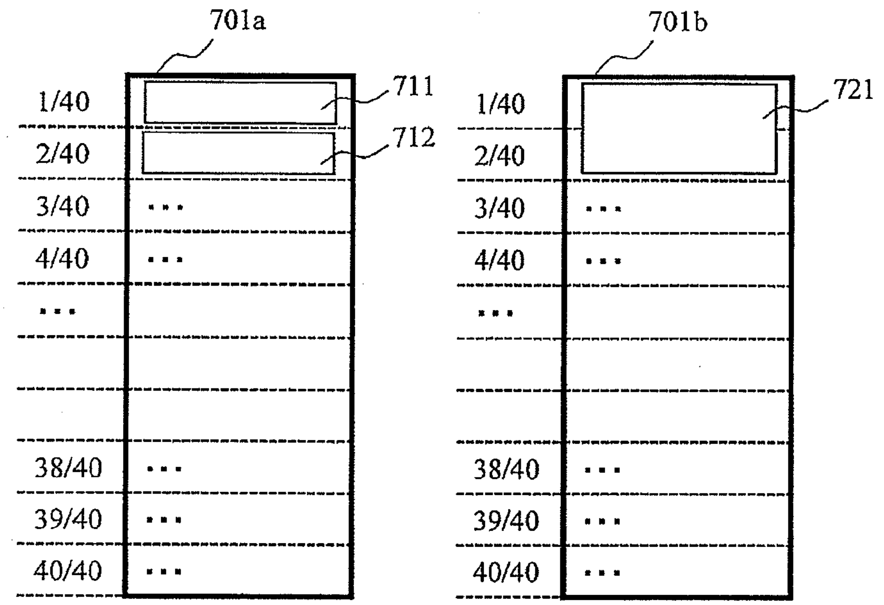
FIG. 7 is a diagram illustrating an example in which the equipment position and configuration information 111 is represented in accordance with a two-dimensional model.
FIG. 8 is a diagram illustrating a configuration example of facility information 800 configuring a part of facility position and configuration information 112.
FIG. 9 is a diagram illustrating a configuration example of air supply and air return port information 900 configuring a part of the facility position and configuration information 112.

These information items described in the equipment position information 300 may be managed as a table form, and may also be managed as a two-dimensional or a three-dimensional model. An example of the information managed as a two-dimensional model is illustrated in FIG. 7.

(ii) Frame Position Information

FIG. 4 is a diagram illustrating the frame position information 400 configuring a part of the equipment position and configuration information. The frame position information 400 includes a frame ID 401, position information 402, and frame information 403 as configuration information.

The frame ID 401 is information for identifying a frame which stores the IT equipment items. The frame such as a rack and a chassis is uniquely identified by this information. The position information 402 is information for indicating a place in which the frame is installed. The position information 402 may be represented by using coordinates in a room as well as may be represented by using tiles on a floor of a room (data center) (how many tiles lie to the left of and above a particular tile), or by a position in a rack column. The frame information 403 is information for identifying a specification of a frame. Detailed information on the frame information 403 will be described later with reference to FIG. 5.

(iii) Frame Specification Information

FIG. 5 is a diagram illustrating the frame specification information 500 for complementing the frame position information 400 configuring a part of the equipment position and configuration information 111. The frame specification information 500 includes the frame information 403 and size information 502 as configuration information.

This frame information 403 corresponds to the frame information of FIG. 4. The size information 502 is information showing the sizes of the frames described in the frame information 403. The size information 502 is information showing the sizes (lengths) of the frames in the X, Y, and Z directions (length, width, and height). If m is adopted as the standard unit, it can be seen that the frame is 1 m long and wide, and 2 m high.

(iv) Machine Model Specification Information

FIG. 6 is a diagram illustrating information showing hardware specifications of the IT equipment items corresponding to the machine model information 303. Machine model specification information 600 includes the machine model information 303, inlet information 602, outlet information 603, and heat generation amount information 604 as configuration information.

The inlet information 602 shows information of an inlet of the IT equipment (a position, a direction, and an air volume). The outlet information 603 shows information of an outlet of the IT equipment (a position, a direction, and an air volume). It is noted that a front surface is an IT equipment surface facing an air supply port of the air conditioner 170 installed in the data center (so-called cold aisle side surface). On the other hand, a back surface is a surface opposite to the surface facing the air supply port of the air conditioner 170 (so-cold hot aisle side surface).

A heat generation amount 604 is information showing a heat generation amount of corresponding one of the IT equipment items. This may be a power consumption amount. The heat generation amount 604 may be a constant value as well as a function which varies in accordance with an equipment workload or the like.

(v) Two-dimensional Model Representation of Equipment Position and Configuration Information FIG. 7 is a diagram illustrating an example in which the equipment position and configuration information 111 is represented by the two-dimensional model. Rectangular frames 701*a* and 701*b* illustrate racks. A rectangular frame 711 shows equipment stored in an uppermost space. A rectangular frame 712 shows equipment stored in a space under the equipment 711. In addition, a rectangular frame 721 is 2U-sized IT equipment or a frame such as a chassis.

<Details of Facility Position and Configuration Information>

Figures 10, 11:
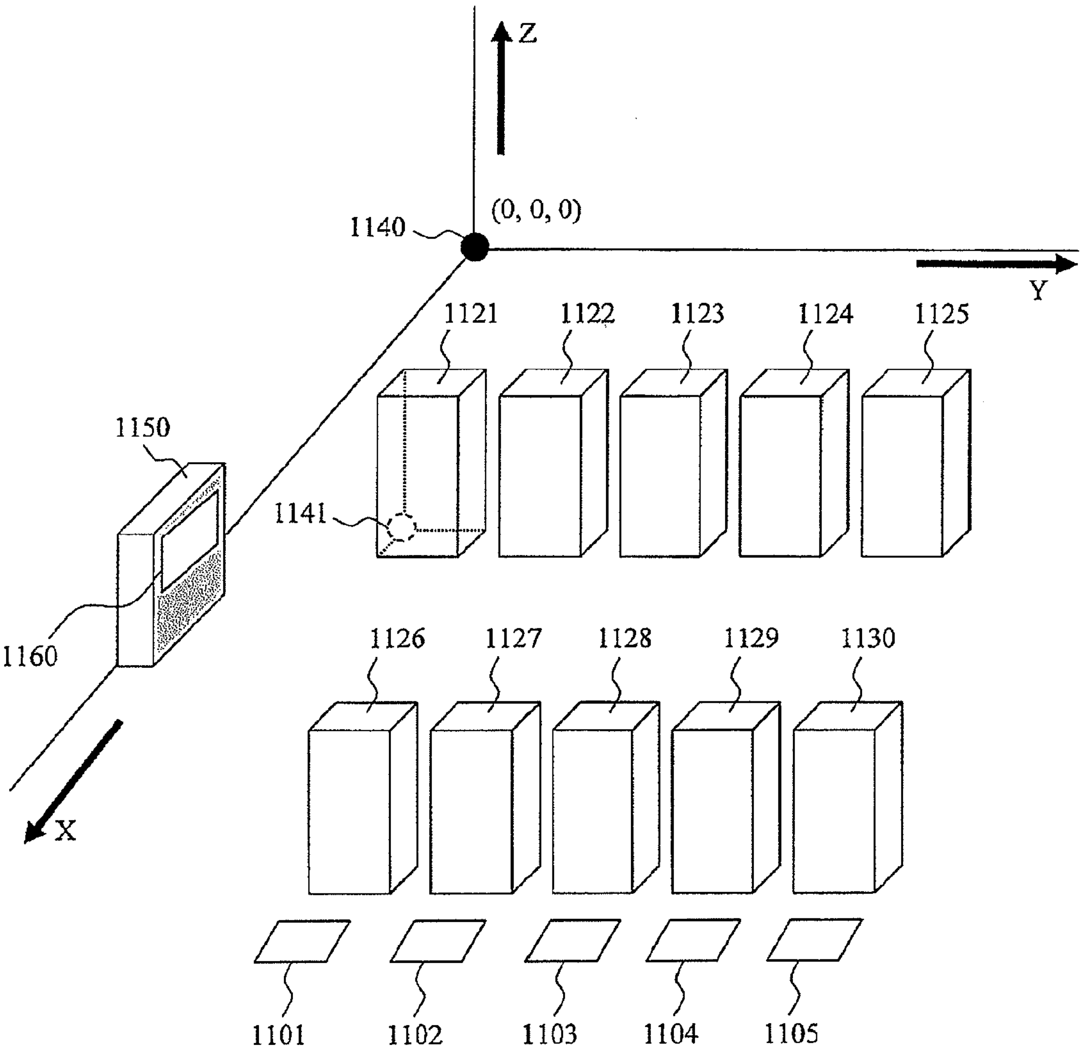
FIG. 10 is a diagram illustrating complementation information 1000 for facility specification information 803 configuring the facility position and configuration information 112.
FIG. 11 is a diagram illustrating an example of a three-dimensional deployment image of the IT equipment and facilities.

FIGS. 8 to 10 are diagrams illustrating details of the facility position and configuration information 112. Hereinafter, each of the drawings will be described. A three-dimensional deployment image of facilities (for example, the air supply ports and the air return ports of the air conditioner) can be created on the basis of the information from FIGS. 8 to 10.

(i) FIG. 8 is a diagram illustrating a configuration example of the facility information 800 configuring a part of the facility position and configuration information 112. The facility information 800 includes a facility ID 801, an air supply and air return port ID 802, and facility specification information 803 as configuration information.

The facility ID 801 is information for identifying facilities. The facilities are uniquely identified by the information. The facility ID 801 is associated with the air supply and air return port ID 802 and the facility specification information 803.

The air supply and air return port ID 802 is information showing identifiers of the air supply ports and the air return ports included in the facilities (air conditioners) identified by the facility IDs 801. Detailed information on the air supply ports and the air return ports is shown in the table 900 of FIG. 9 as described later.

The facility specification information 803 shows information for identifying specifications of the facilities. For example, the information may be model numbers of the facilities. In addition to the model numbers, if the facilities have specification differences which can be partially selected, the information may be attached.

(ii) Air Supply and Air Return Port Information

FIG. 9 is a diagram illustrating a configuration example of the air supply and air return port information 900 configuring a part of the facility position and configuration information 112. The air supply and air return port information 900 is information for managing in which position each air conditioner included in the facility information 800 has an air supply port and an air return port. The air supply and air return port information 900 includes the air supply and air return port ID 802, position information 902, a size 903, and a direction 904, as configuration information.

This air supply and air return port ID 802 is information corresponding to the air supply and air return port ID 802 included in the facility information 800.

The position information 902 is information showing positions of the air supply ports and the air return ports. The information may be information showing coordinates in the room (data center) as well as may be information represented by tiles on the floor of the room. FIG. 9 illustrates an example in which the positions of each air supply port and air return port are represented by the coordinates on the assumption that a predetermined position in the data center room is the coordinate origin. For example, it can be seen that an air supply port 01 is installed on an XY plane (floor surface) of the room.

The size 903 is information showing sizes of the air supply port and the air return port. Now, 0.5 is seen in the size 903, and this means that the size of the air supply port is half of the frame size 1 of the server illustrated in FIG. 5 (for example, 50 cm).

The direction 904 is information showing a vector of air supply or return. For example, the vector (0,0,1) means that the air flows upward. Also, the vector (0,1,0) means that the air return port returns the air from the Y direction.

(iii) Facility Specification Information

FIG. 10 is a diagram illustrating the complementation information 1000 for the facility specification information 803 configuring the facility position and configuration information 112. The complementation information 1000 includes the facility specification information 803, air conditioning characteristic information 1002, and a feature 1003 as configuration information.

This facility specification information 803 is information corresponding to the facility specification information 803 included in the facility information 800.

The air conditioning characteristic information 1002 includes relation information between a heat amount processed in and electrical power required in the air conditioner. The relation information may include multiple items of the relation information (relationship between W and Q) on the basis of environmental information. The environmental information may include relation information based on information such as temperature, humidity, and enthalpy of the external air, temperature, humidity, and enthalpy of air returned from the room, as well as restrictions of temperature, humidity, and enthalpy of air supplied to the room.

The feature 1003 is information showing feature of the facilities (air conditioners). For example, an air conditioner which takes in external air is represented by an external air conditioner. An air conditioner which circulates and uses the air in the room is represented by a rack-type air conditioner.

<Deployment Drawing of IT Equipment and Facilities>

FIG. 11 is a diagram illustrating an example of a three-dimensional deployment image of the IT equipment items and the facilities represented in accordance with FIGS. 3 to 10. However, the image of this three-dimensional deployment may not necessarily be displayed on the display screen of the management server 101 as well as may be displayed in response to an instruction from the administrator.

In FIG. 11, the entire data center room or a part of the room is shown in accordance with the coordinates. Positions of each item of the IT equipment and each facility are represented in accordance with the coordinates. For example, on the assumption that a corner point 1140 of the room is the origin point (0,0,0), the X, Y, and Z axes are configured as shown in FIG. 11.

In FIG. 11, reference numerals 1101 to 1105 denote the air supply ports of the air conditioners. Reference numerals 1121 to 1130 denote the racks. In addition, points 1140 and 1141 show examples of the coordinates (in particular, reference numeral 1140 denotes the coordinate origin). Furthermore, reference numeral 1150 denotes the air conditioner and reference numeral 1160 denotes the air return port of the air conditioner 1150.

Cold air is discharged from the air supply port, taken in the front surface (seen from the air supply port) of the equipment stored in the rack, and discharged from the back surface as hot air. Then, the hot air is taken in the air return port, cooled down, and supplied from the air supply port. Afterwards, this pattern repeats itself. It should be noted that an aisle in which the air supply ports are allocated is referred to as a cold aisle and an aisle in which the air supply ports are not allocated is referred to as a hot aisle.

<Allocation Rule Derivation Processing>

FIG. 12 is a flow chart for illustrating the processing of the allocation rule derivation program 110 according to the embodiment of the present invention. The allocation rule derivation program 110 derives the allocation rules 113 by using the equipment position and configuration information 111 and the facility position and configuration information 112.

In step 1201, the allocation rule derivation program 110 constructs a three-dimensional model by using the equipment position and configuration information 111 and the facility position and configuration information 112. An example of the three-dimensional model is as illustrated in FIG. 11. However, the model constructed as described above may not necessarily be displayed. What is needed is that the allocation rule derivation program 110 knows positions of the air supply port and the air return port of each IT equipment item and each air conditioner. It should be noted that information on the air volume of the air conditioning facilities will be considered in next step 1202.

In step 1202, the allocation rule derivation program 110 derives an air conditioner operation state for reducing a total amount of power consumption of the air conditioner on the basis of the air conditioning characteristic information 1002 in a case where an amount of heat generated from the IT equipment is a certain value Q. An air volume in the operation state is added to the three-dimensional model constructed in step 1201 and then simulation of the air flow is performed. More specifically, for example, if three items of the IT equipment are allocated, a vector field showing the flow of the air from the air conditioner is created from the three-dimensional model constructed in step 1201 to allocate the IT equipment items while avoiding the spaces of the racks around which much air flows. The amounts of heat generated from the IT equipment items are same, but electrical power which is consumed in the air conditioner may make a big difference in accordance with deployment. It is because if the IT equipment items are allocated in places around which much air flows, cooling efficiency by the air conditioner is reduced, and thereby power consumption of the air conditioner is increased.

In simulation, space of the room from which heat would generate is divided into several blocks, and these divided blocks are called as space blocks as below. In simulation, space blocks may be defined statically as well as dynamically so that required calculation resources in simulation would be decreased.

In step 1203, the allocation rule derivation program 110 saves relationship between space blocks constituting allocation rules and powers estimated that is necessary to the air conditioner when heat generates form the space blocks, based on the simulation result. For example, where heat q1 and q2 (q2=Q−q1) is generated from space block a1 and space block a2, respectively, power values estimated which are necessary to the air conditioner are often obtained from a formula of "q1*w1+q2*w2" and air conditioning characteristic information 1002. A distribution of heat amount can be represented by combining the space blocks and heat generated. Further, the power necessary to the air conditioner under the distribution of heat amount can be estimated by using the above relationship.

In step 1204, the allocation rule derivation program 110 determines whether or not there is another air conditioner operation state to reduce the total amount of the power consumption of the air conditioners even in a case where the amounts of heat generated from the IT equipment items are equally Q on the basis of the external air and the environmental state in the room (see FIG. 13). Namely, for example, it is determined whether or not to perform the simulation with the external air conditioner. If there is no other air conditioner to be added to the simulation (if no in S1204), the processing proceeds to step 1205. If there is another air conditioner to be added to the simulation (if yes in S1204), the processing loops back to step 1202, and the flow of the air is simulated again. For example, if ambient temperature, which is one of the environmental information items, is low, main use of the external air conditioner using the external air may result in a lower total amount of the power consumption of the air conditioners. On the other hand, if the ambient temperature is high, main use of other local air conditioning without using the external air may result in lower power consumption of the air conditioners. Thus, it is determined whether or not to perform the simulation with another air conditioner added on the basis of an environment (for example, external air, humidity, and enthalpy). Because the air flow is changed if another air conditioner is added, the simulation needs to be carried out again. Thus, an air conditioner operation state for reducing total power consumption of the air conditioner is simulated repeatedly in steps 1202 to 1204.

In step 1205, the allocation rule derivation program 110 prioritizes the virtual server allocations to the IT equipment on the basis of the simulation result in step 1202. For example, in the vector field considered in step 1202, the virtual server allocations to the IT equipment may be prioritized on the basis of the percentage of the air discharged into the hot aisle side flowing around into the cold aisle side. Thus, a total amount of the power consumption of the air conditioner can be reduced by attaching a lower virtual server allocation priority to the equipment that the discharged air flows around into the cold aisle side and then allocating the virtual server preferentially to the higher-priority equipment.

In step 1206, the allocation rule derivation program 110 gradually changes a total amount of heat generated from the IT equipment items Q (for example, Q=1, 2, . . . ) and repeats step 1202 to step 1205.

In step 1207, after the allocation rule derivation program 110 performs all the simulations of a total amount of heat generated from the IT equipment items, the allocation rule derivation program 110 creates the allocation rules 113 of the virtual servers. The allocation rules 113 of the virtual servers are described with reference to FIGS. 13 and 14.

<Environmental State Information>

FIG. 13 is a diagram illustrating a configuration example of the environmental state information 1300 used to create the allocation rules 113. The environmental state information 1300 includes a state ID 1301 and state contents 1302 as configuration information.

The state ID 1301 is an identifier for uniquely identifying a state. The state contents 1302 include classification information such as temperature, humidity, and enthalpy of the external air, temperature, humidity, and enthalpy of the return air from the room, temperature, humidity, and enthalpy of the air supplied to the room. The state contents 1302 are associated with the state ID 1301 for each classification.

For example, a state I_001 is a state in which an external air enthalpy E is lower than a predetermined value E1. In such a case, for example, it is recommended that the external air be used as it is. In addition, a state I_002 is a state in which the external air enthalpy E is equal to or higher than the predetermined value E1 and lower than a predetermined value E2. In such a case, for example, it is recommended that the external air be cooled and then used. Furthermore, a state I_003 is a state in which the external air enthalpy E is equal to or higher than the predetermined value E2. In such a case, for example, it is recommended that internal air be circulated without using the external air.

<Example of Allocation Rule>

FIG. 14 is a diagram illustrating an example of the allocation rules 113 created in the processing of FIG. 12. The allocation rules 113 include a rule ID 1401, a condition 1402, and a recommended VM movement rule 1403 as configuration information. The rule ID 1401 is an identifier for uniquely identifying each rule. The condition 1402 is represented by the state ID 1301. The recommended VM movement rules 1403 show information for recommending how the virtual server should be allocated in the physical server in such a case where the state is represented by the condition 1402. The allocation rules 113 (recommended VM movement rules 1403) may be created by the administrator on the basis of the vector field created at the time of the simulation in step 1202 of FIG. 12 as well as may also be automatically created in accordance with a relationship between a predetermined vector field and an allocation rule. From FIG. 14, multiple allocation rules are created. For example, the virtual servers may be collected around a specific air supply port 01, may be collected in lower rack spaces, may be collected in upper rack spaces, may be collected in the specific rack 01, and may be collected in a specific room Room 01. In addition, the equipment items are prioritized and the priorities may be held. Also, an evaluation value is given for each equipment item and the evaluation value may be held. An allocating plan which is actually used is determined from the allocation rule by applied rule selection and allocating plan derivation processing described later.

<Sensor Information>

FIG. 15 is a diagram illustrating a detailed example of the sensor information 121. The sensor information 121 is a collection of environmental information items at a certain time (present time, an average across a predetermined period, and the like). The sensor information 121 includes a sensor ID 1501, position information 1502, sensor information 1503, and a sensor type 1504.

The sensor ID 1501 is an identifier for uniquely identifying a sensor. The position information 1502 is information showing positions of the sensors. The positions may be represented in accordance with the three-dimensional coordinates as well as may also be represented by using the installed equipment items and the frames. The sensor information 1503 shows a measurement value of the sensor. The measurement value may be a momentary value and an average value across a predetermined period. The sensor type 1504 shows types of the sensors. For example, the types include temperature, humidity, enthalpy, and an air volume.

<System Configuration Information>

FIG. 16 is a diagram illustrating a configuration example of the system configuration information 122. The system configuration information 122 includes a system ID 1601, virtualized information 1602, operation equipment information 1603, movability 1604, and a resource size 1605 as configuration information.

The system ID 1601 is an identifier for uniquely identifying a system.

The virtualized information 1602 shows whether or not a system is a virtualized system. For example, if the system is virtualized, "virtual" is input and if not virtualized, "N/A" is input.

The operation equipment information 1603 is information for identifying IT equipment on which a system corresponding to a system ID operates.

The movability 1604 is information showing whether or not a system is movable.

The resource size 1605 is information showing size of a resource (for example, memory capacity, a CPU core, and a disk device) which a corresponding system uses (the resource is allocated to a system).

<Equipment and Facility Operation Information>

Figures 17, 18:
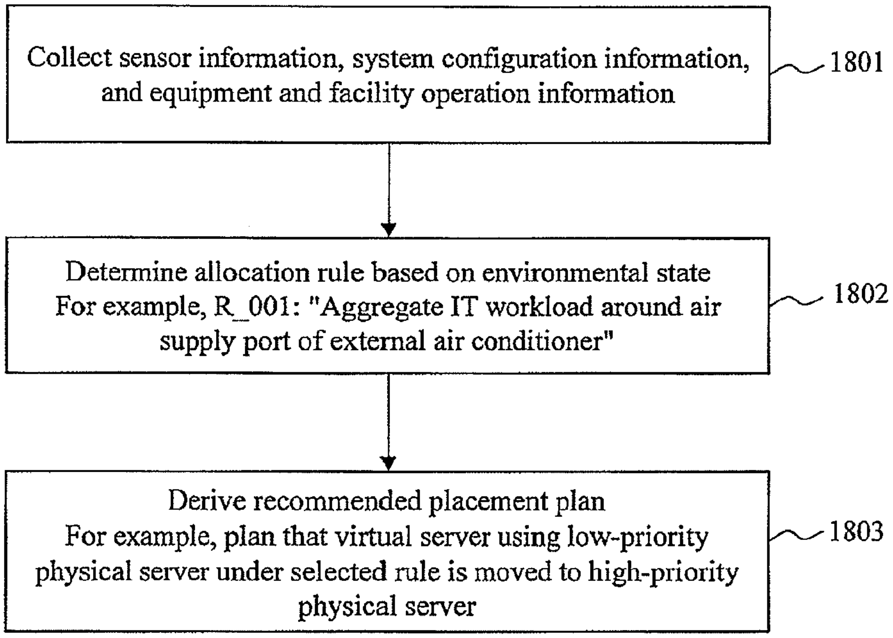
FIG. 17 is a diagram illustrating a configuration example of equipment and facility operation information 123.
FIG. 18 is a flow chart for illustrating processing of an applied rule selection and allocating plan derivation program 120.

FIG. 17 is a diagram illustrating a configuration example of the equipment and facility operation information 123. The equipment and facility operation information 123 is information for managing operation (ON and OFF) of each IT equipment item and each air conditioner. The equipment and facility operation information 123 includes an equipment and facility ID 1701 and power supply information 1702 as configuration information.

<Applied Rule Selection and Allocating Plan Derivation Processing>

FIG. 18 is a flow chart for illustrating the processing of the applied rule selection and allocating plan derivation program 120 according to the embodiment of the present invention.

In step 1801, the applied rule selection and allocating plan derivation program 120 collects the sensor information 121, the system configuration information 122, and the equipment and facility operation information 123, and acquires environmental information including an external air state, air return in the server room, and an amount of heat generated in the equipment.

In step 1802, the applied rule selection and allocating plan derivation program 120 determines the corresponding condition 1402 with reference to FIG. 14 and determines the recommended VM movement rule 1403 on the basis of the environmental information acquired in step 1801. Namely, environmental information obtained in step 1801 is compared with FIG. 14 and the recommended VM movement rule matched with the obtained condition is obtained.

In step 1803, the applied rule selection and allocating plan derivation program 120 derives a virtual server allocating plan on the basis of the recommended VM movement rule 1403 determined in step 1802. For example, the applied rule selection and allocating plan derivation program 120 determines the number of required equipment items on the basis of the system configuration information 122 and may select the required number of equipment items on the basis of the recommended VM movement rule 1203. Alternatively, in the recommended VM movement rule 1203, the applied rule selection and allocating plan derivation program 120 may hold as an allocating plan a result that the virtual server using the equipment having a low priority order moves into the equipment having a high priority order. Moreover, the allocating plan may have estimated time information of deployment in the future. It should be noted that the applied rule selection and allocating plan derivation program 120 may display an allocating plan which can be recommended on the display screen as a UI so that the administrator can select a desired plan. If there are multiple plans, one of them may be selected. If there is only one allocating plan to be recommended, the administrator may determine whether or not to select it.

Figure 19:
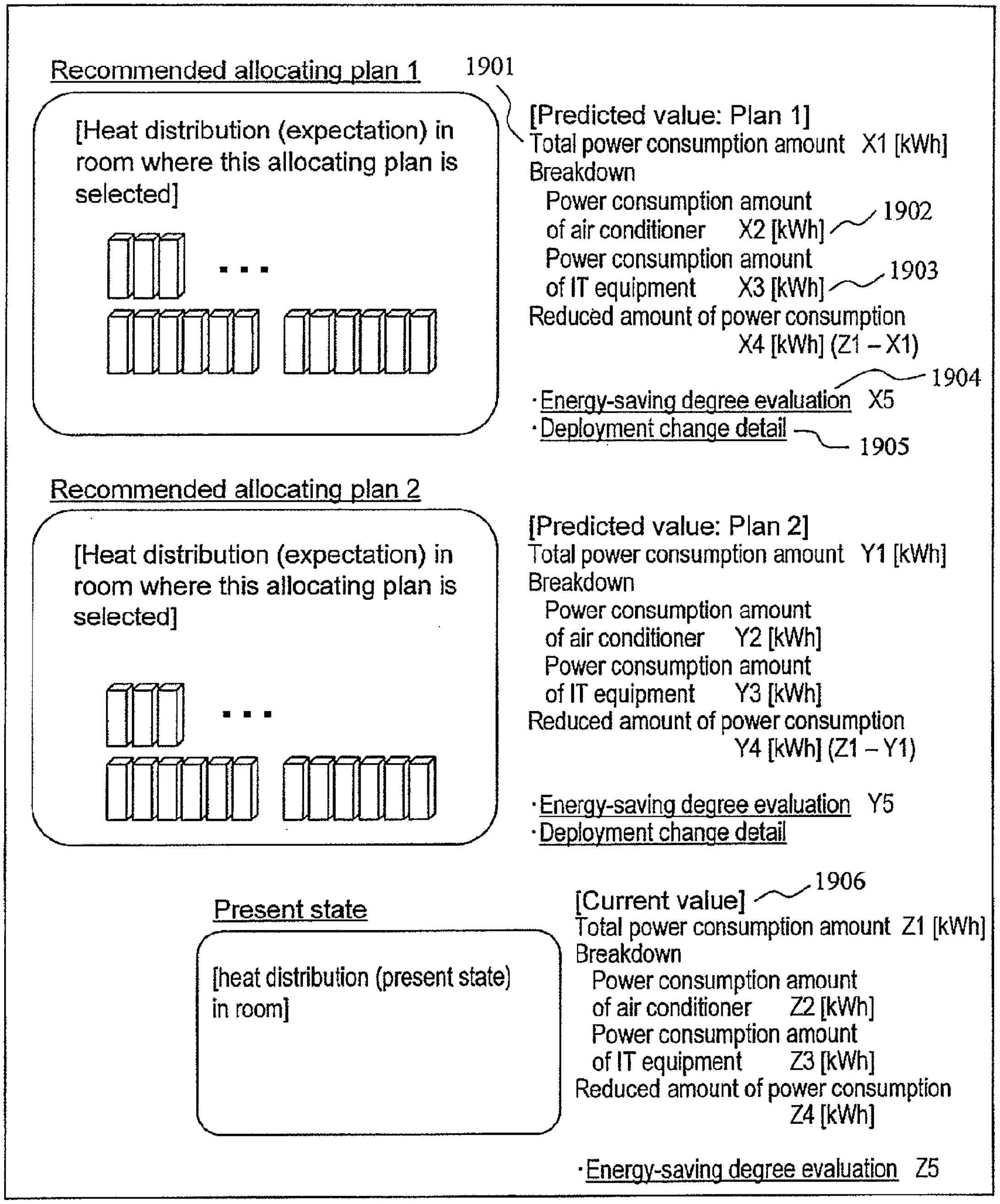
FIG. 19 is a diagram illustrating a GUI example for an administrator to determine a plan adopted from recommended allocating plans.

FIG. 19 is a diagram illustrating a GUI example in which the administrator determines a plan adopted from the recommended allocating plans.

As illustrated in FIG. 19, total power consumption expectation and power consumption reduction amount from the present state are presented to the administrator by each recommended allocating plan. In total power consumption X1 1901 (Y1 and Z1 also represent total power consumptions), a breakdown of a power consumption amount about the air conditioner X2 1902 (Y2 and Z2 also represent power consumption amounts about the air conditioner) and a power consumption amount about the IT equipment X3 1903 (Y3 and Z3 also represent power consumption amounts about the IT equipment) is displayed. Further, reduced amount of power consumption X4 (Y4 and Z4 also represent reduced amounts of power consumption) is displayed.

In addition, energy-saving degree evaluation X5 1904 (Y5 and Z5 also represent energy-saving degree evaluations) is a value that an operational state of the data center is comprehensively evaluated in terms of power consumption. For example, the value is obtained by comprehensively evaluating the fact that there are no heat accumulation, super cooling, waste in air volume supplied by the air conditioner, an ON state of unnecessary IT equipment, and the like.

A deployment change detail 1905 is information in which items on information on virtual servers moved from the present state are summarized. Information on evaluation of man-hours associated with deployment change may be presented.

In addition, a current value 1906 of a thermal distribution in the room is also displayed. This enables the administrator to compare the present deployment with the changed deployment, and thereby the administrator can select a desired allocating plan as needed on the basis of the information described above.

<Virtual Server Reallocating Processing>

Figure 20:
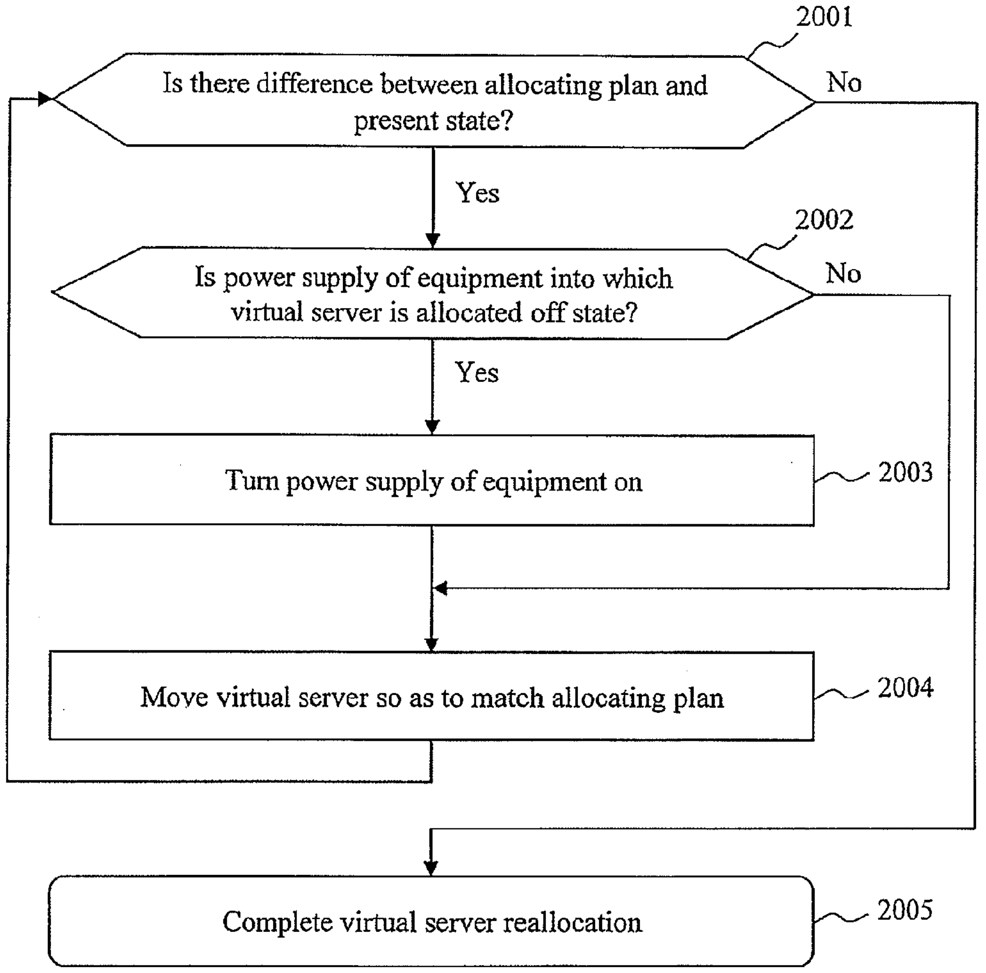
FIG. 20 is a flow chart for illustrating processing of a virtual server controlling program 130 and a power supply controlling program 140.

FIG. 20 is a flow chart for illustrating the processing of the virtual server controlling program 130 and the power supply controlling program 140 according to the embodiment of the present invention.

In step 2001, the virtual server controlling program 130 compares the allocating plan 124 determined by the applied rule selection and allocating plan derivation processing (FIG. 18) with present deployment based on the system configuration information 122, and determines whether or not there is difference. If there is no difference (no in S2001), the virtual server reallocating processing is ended. If there is difference (yes in S2001), the processing proceeds to step 2002.

In step 2002, the virtual server controlling program 130 determines whether or not the power supply of the IT equipment into which the virtual server is allocated is an OFF state on the basis of power supply information 1702 (FIG. 17). The power supply of the targeted IT equipment is an OFF state (no in S2002), the processing proceeds to step 2004. If the power supply of the targeted IT equipment is an ON state (yes in S2002), the processing proceeds to step 2003.

In step 2003, the virtual server controlling program 130 uses the power supply controlling program 140 to turn the power supply of the IT equipment on.

In step 2004, the virtual server controlling program 130 moves the virtual server into the targeted IT equipment (power supply: ON).

Next, the processing loops back to step 2001 where the virtual server controlling program 130 determines whether or not the allocating plan 124 is different from the present deployment. If it is determined that there is no difference (no in S2001), the processing proceeds to step 2005, and the virtual server reallocating is ended.

(2) Second Embodiment

In the first embodiment, by changing the physical server on which the virtual server operates, a generated heat amount and a heat amount distribution are changed to reduce a heat amount of the entire system.

On the other hand, a scheme may be adopted in which by moving data stored in the storage device 160, a generated heat amount consumed by the air conditioner and a heat amount distribution are changed to reduce the heat amount in the entire system. If a common disk image and difference data in two or more systems are stored in the storage device, a moved data amount can be reduced by storing the common disk image in a destination storage device in advance and moving the difference data at the time of data moving into the other system. By moving the data into the other system, accordingly a generated heat amount and a heat amount distribution are also moved, and thereby the power consumption of the entire system may be reduced.

Figure 21:
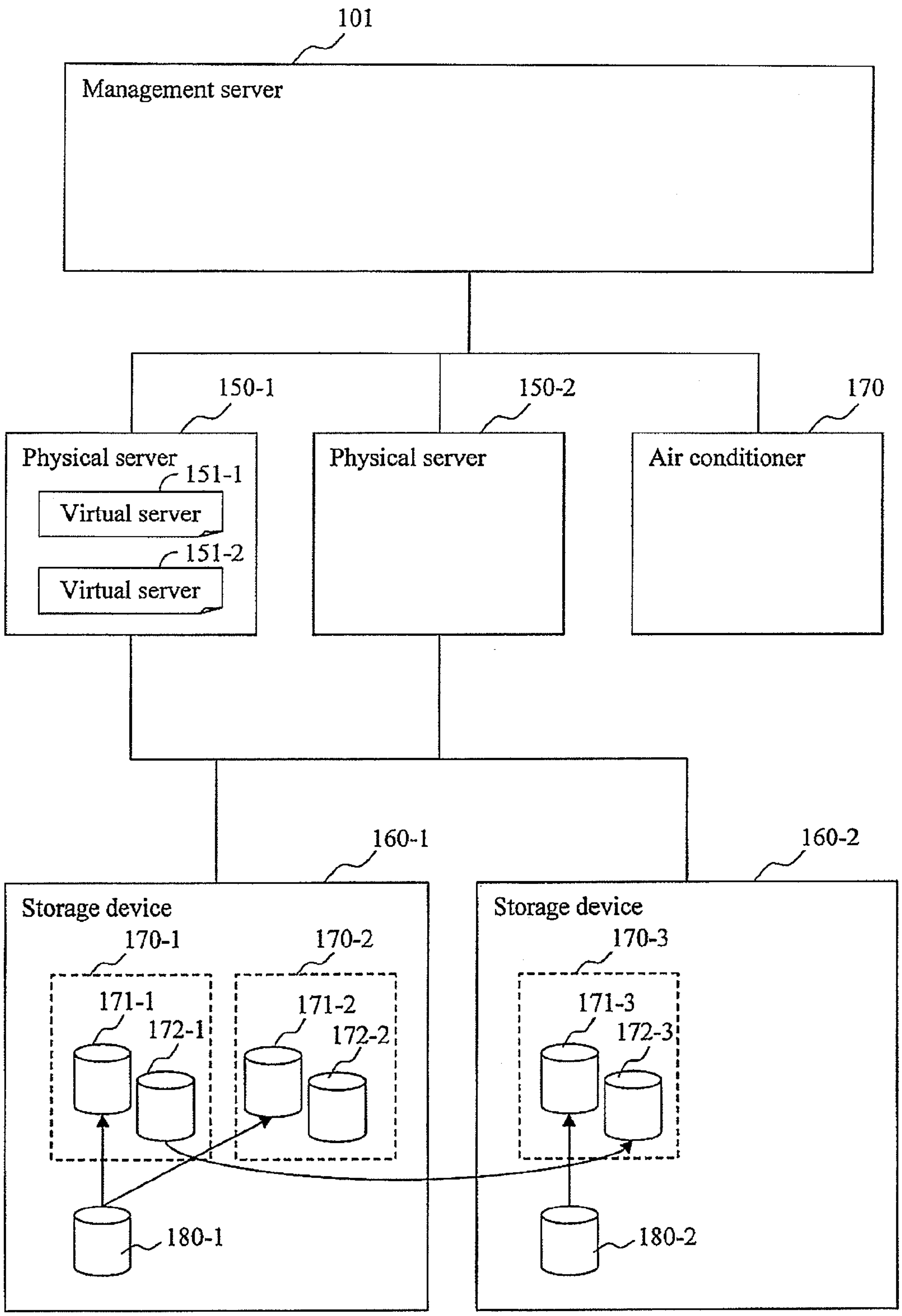
FIG. 21 is a diagram for illustrating power consumption reduction in the data center in a second embodiment.

With reference to FIG. 21, power consumption reduction of the data center according to the second embodiment will be described.

First, in the IT equipment management system (also referred to as the computer system) 100, it is assumed that in an environment where common volumes 180-1 and 180-2 are stored in a storage device 160-1 and a storage device 160-2, respectively, virtual servers 151-1 and 151-2 are running by using these common volumes.

The common volume 180-1 is copied as a volume 171-1 for the virtual server 151-1 and copied as a volume 171-2 for the virtual server 151-2. The differences are each stored as the volume 172-1 and the volume 172-2. That is, a disk image of the virtual server 151-1 is stored in a group 170-1 in the storage device, the group 170-1 consisting of the volume 171-1 and the difference volume 172-2.

In moving the group 170-1 from the storage device 160-1 to the storage device 160-2, a disk image is moved without copying all the volumes from one storage device to another. Namely, a common volume with the common volume 180-1 is stored as the volume 180-2 in the storage device 160-2 in advance, and then by copying the volume 180-2, the volume 171-3 is held. Then, the difference volume 172-1 is copied from one storage to the other as a volume 172-3. This allows the group 170-3 to be held in the storage device 160-2, the storage device accessed by the virtual server 151-1 to be moved, a heat amount generated by the storage device and a heat amount distribution to be changed.

As described above, if a situation in which the volume is moved to stop spinning of a source disk device can be created, the number of the disk devices to be operated can be reduced and the heat generation amount in the storage device can be reduced. In addition, in the storage device, positions of the disk devices from which the heat is generated can also be distributed.

It should be noted that the present embodiment is more effective if a long-term trend in the storage device is observed and predicted to move the volume. Namely, once the volume is moved, it is more likely that an advantage is provided if the volume is not returned to the source system. In addition, when it comes to the determination of whether or not the movement in the second embodiment is proper, in the same manner as the first embodiment, the processing of FIG. 12 is executed to create an allocation rule, the processing of FIG. 18 is executed to create a recommended allocating plan, and the processing of FIG. 20 is executed to reallocate the volumes. In this case, the words in the processing are changed to other words as needed. For example, the phrase "virtual server" is read as a "volume" and the "physical server" is read as a "storage device.

(3) Third Embodiment

In the first embodiment, by changing the physical server on which the virtual server operates, a generated heat amount and a heat amount distribution are changed to reduce a heat amount of the entire system.

However, if a physical server to be operated is changed without turning off the power supply of the virtual server, sometimes one or more physical servers need to be grouped in advance. That is, the virtual server can freely move between physical servers in the same resource group, but cannot move into a physical server in another group. The recommended VM movement rule 1203 may have a function to group one or more physical servers so that the virtual server can move into a higher-priority physical server. The processing from deriving a recommended allocating plan to presenting it is same as that of the first embodiment.

Figure 22:
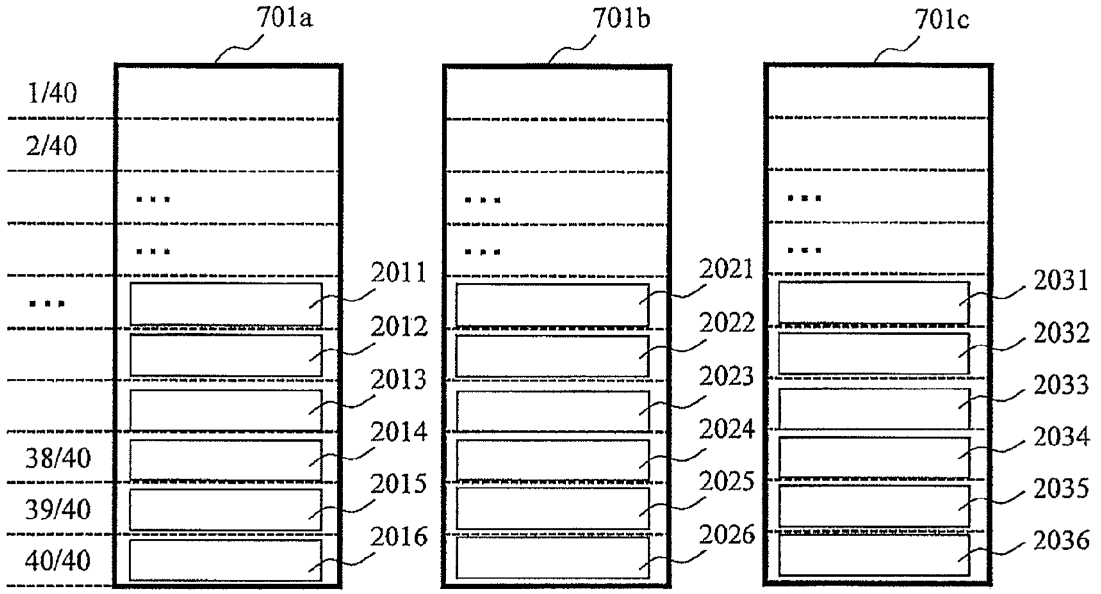
FIG. 22 is a diagram illustrating equipment position and configuration information in a third embodiment in accordance with a two-dimensional model.

The grouping function will be described with reference to FIGS. 22 to 24. FIG. 22 is a drawing in which equipment position and configuration information of the third embodiment is represented by the two-dimensional model. The rectangular frames 701*a*, 701*b*, and 701*c* (same as those in FIG. 7) show racks. Rectangular frames 2011 to 2016, rectangular frames 2021 to 2026, and rectangular frames 2031 to 2036 show physical server equipment items stored in the racks 701*a* to 701*c*.

<Example of Grouping Susceptible to Disadvantage>

Figure 23:
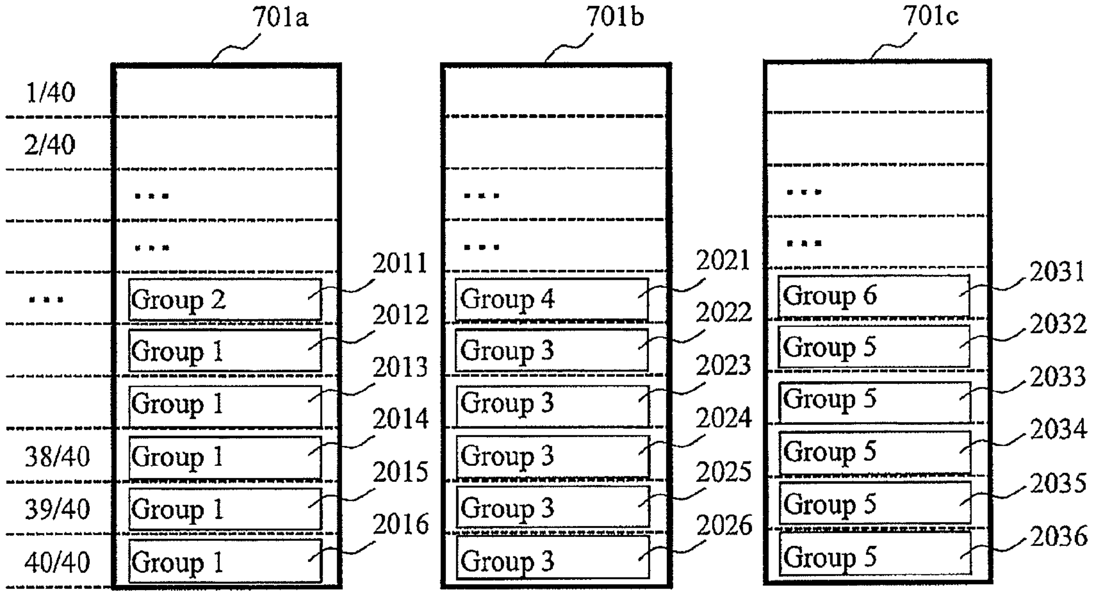
FIG. 23 is a diagram illustrating an example of resource grouping susceptible to a disadvantage that when a virtual server is moved on the basis of an allocating plan, the allocating plan cannot be applied.

FIG. 23 is a diagram illustrating an example of resource grouping susceptible to a disadvantage that an allocating plan cannot be applied when the virtual server is moved on the basis of the allocating plan. In FIG. 23, when the load is low, it is impossible to collect the virtual servers of resource GROUPs 2, 4 and 6 in the physical servers stored in lower spaces of the racks. It is because the server of each resource group does not exist in lower spaces of each rack. Also, it is impossible to collect the virtual servers in one or two racks. It is because each rack does not include all the resource groups.

When the load is low, if the virtual servers in the multiple resource groups (a resource pool: a group of the physical servers created to create virtual machines) are collected into one of the racks, multiple resource pools will include at least one or a part of the IT equipment items (physical servers) stored in the rack into which the virtual servers are collected. Also, when the load is low, if the virtual servers in multiple resource pools are collected into one rack row (for example, the bottom row), the multiple resource pools will include at least one or a part of the IT equipment items (physical servers) stored in at least one of the racks into which the virtual servers are collected. In addition, when the load is low, if the virtual servers in the multiple resource pools are collected into one room, multiple resource pools will include at least one or a part of the IT equipment items (physical servers) stored in at least one rack in the room into which the virtual servers are collected.

If it is contemplated that there are a plurality of collecting ways adopted when the load is low; for example, if it is contemplated that there are a way to collect the virtual servers into lower spaces of a rack and a way to collect the virtual servers into one rack, each rack will include at least one or a part of the IT equipment items (physical servers) in each of the other racks.

As seen from FIG. 23, the grouping example illustrated in FIG. 23 cannot be applied to any one of the collection modes described above. FIG. 24 described later shows an example in which the above-described multiple collections are met. It should be noted that the same is equally true of not only the case in which the load is low, but also the case in which the virtual servers are collected into a few racks when the load is moderate.

<Improved Grouping Example>

As described above, when the grouping of the physical servers (resource pool) is not properly created, even if a recommended allocating plan is presented, sometimes the virtual servers may not be moved in accordance with the presented plan. Thus, the resource pool should be properly configured. FIG. 24 is a diagram illustrating an example of improved resource grouping in comparison with FIG. 23.

Figure 24:
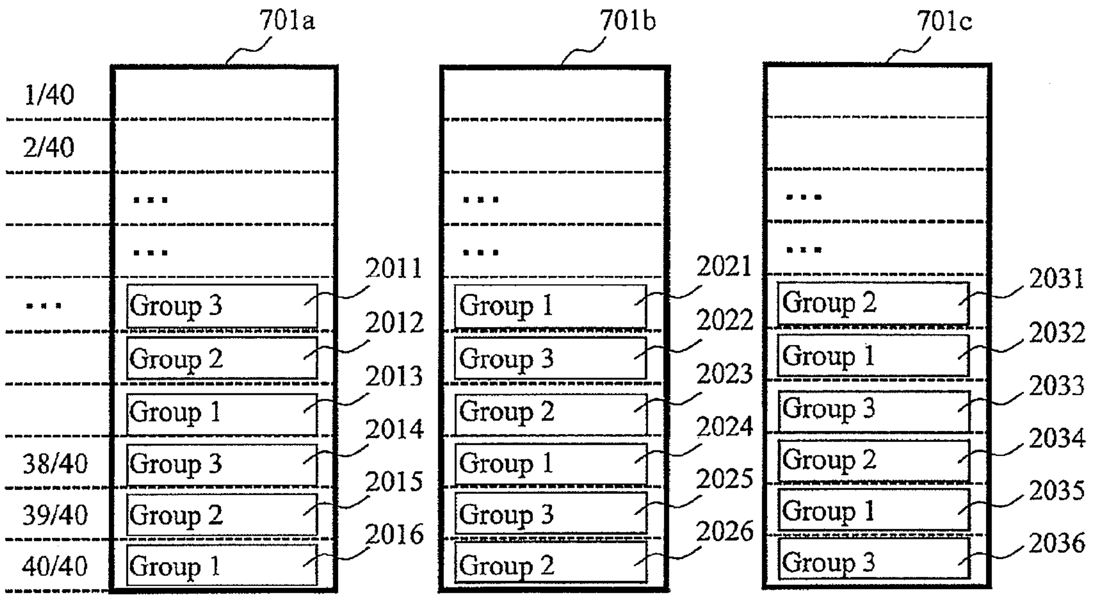
FIG. 24 is a diagram illustrating an example of improved resource grouping.

In FIG. 24, the physical server equipment 2011 is grouped into the group 3, the physical server equipment 2012 is grouped into the group 2, and the physical server equipment 2013 is grouped into the group 1. For example, if the recommended VM movement rule 1203 is a rule "use a lower space of the rack," since each group lies in the bottom spaces of the different racks, the virtual server in the group 1 preferentially uses the physical server 2016, the virtual server in the group 2 preferentially uses the physical server 2026, and the virtual server in the group 3 preferentially uses the physical server 2036. This enables a higher-priority physical server to be used when the load is low in the recommended VM movement rule.

Also, if the recommended VM movement rule 1203 is a rule "use the rack 701*a*," since all the groups are included in the rack 701*a*, a higher-priority physical server can be used in accordance with the rule.

In addition, because the racks other than the rack 701*a* include all the groups, the virtual servers can also be collected into the racks other than the rack 701*a* (when the load is low).

Also, the same is true of the case in which the virtual servers are collected into the racks 701*b* and 701*c* or the case in which the rack is allocated in combination with another rack (in the case where the virtual servers are allocated in the two racks 701*a* and 701*b*).

<Conclusion>

The embodiment according to the present invention constructs a three-dimensional model of each equipment item and facility in the data center on the basis of position information of the multiple IT equipment items and the air conditioning facilities in the data center (for example, positions of the air supply port and the air return port of the air conditioner), equipment configuration information showing a configuration for cooling the IT equipment in the multiple IT equipment items (for example, positions of the inlet and the outlet, directions of intake air and exhaust air, and air volume), and facility configuration information including air conditioning characteristic information in the air conditioning facilities (sizes of the air supply port and the air return port as well as directions of the supplied air and return air). A vector field showing a flow of air in the three-dimensional model is created. Then, in accordance with the vector field, an allocation rule indicating a plurality of allocation patterns of the multiple IT equipment items in the data center is created. In the allocation patterns, power consumption of the air conditioning facilities is lower than power consumption of the present state. The allocating plan of the IT equipment items in the data center is presented in accordance with the created allocation rule. This enables IT equipment deployment in which the power consumption amount is lower than the present state to be provided without strictly calculating the power consumption required for air conditioning facilities. Namely, the deployment of the equipment items in the data center with efficient power consumption can be achieved without extremely increasing calculation cost.

Also, in accordance with an environmental state in or out of the data center, in addition to an internal air circulating air conditioner, an external air conditioner which uses an external environment to carry out the cooling may be added to the operation for generating the vector field in order to create multiple allocation patterns in which the power consumption of the internal air circulating air conditioner and the external air conditioner is lower than the power consumption of the present state. This allows for addressing a case in which using an external air conditioner to cool the data center is more efficient depending on a state of the external air for each season.

It should be noted that, in the above-described vector field, IT equipment deployment in which an amount of air flowing around is lower than the present state deployment is regarded as an allocation pattern in which the power consumption amount of the air conditioner is lower than the power consumption amount by the deployment of the present state, and the allocation rule is generated.

Furthermore, in the embodiments, environmental information including an external air state of the server center, a return air state of the server center, and a heat generation amount of the IT equipment is compared with the allocation patterns included in the allocation rules to derive and present an allocating plan to be recommended. This allows for presenting an allocating plan which can reduce a power consumption amount and matches with an environment of the present state. It should be noted that, evaluation of a power consumption amount and an energy-saving degree where an allocating plan to be recommended is selected may be compared with evaluation of a power consumption amount and an energy-saving degree where the deployment of the present state is adopted, and a comparison result may be represented by using a GUI (graphic user interface). This enables the administrator to select a desired allocating plan from the allocating plans to be recommended.

If the IT equipment items are physical servers for achieving virtualized servers, when there is a difference between an allocating plan and the present state deployment of the physical servers on which the virtual servers operate, it is confirmed that the physical servers to be a destination of the virtual servers indicated by the allocating plan are in an operating state, thereafter moving the virtual servers so as to match the allocating plan. In virtual servers, it is not necessary to physically move the equipment, but if the physical servers which are destinations are not operating, the virtual servers cannot be moved into the physical servers. Therefore, as described above, a selected allocating plan can certainly be achieved by confirming an operating state of each physical server.

The multiple physical servers are dispersed into the multiple racks. Some of the multiple physical servers compose one resource group, and a plurality of resource groups, each which includes the multiple physical servers, exist. Typically, the virtual server can move only between the physical servers which belong to the same resource group. In this case, each of the multiple racks has the physical servers belonging to all the resource groups. For example, if there are 1 to N resource groups, each rack stores the physical servers included in all the 1 through N resource groups. Also, in each rack, the physical server in the bottom space may belong to different resource groups. This can avoid the situation in which the allocating plan cannot be achieved when the presented deployment is achieved by moving the virtual servers.

On the other hand, if the IT equipment items are the storage devices for providing logic volumes, when there is difference between the allocating plan and the present state deployment of the logic volumes in the storage devices, it is confirmed that the storage device to be a destination of the logic volume indicated by the allocating plan is operating, and thereafter the logic volume is moved so as to match the allocating plan. The logic volume which moves may include, for example, an original snapshot which is a base of a writable snapshot, and difference data for configuring the writable snapshot (WSS). As described above, by moving the logic volume on the basis of an operation state of the storage device, the storage device to be operated can be organized to improve cooling efficiency in the data center.

The present invention may also be achieved by a program code of software for achieving the functions of the embodiments. In this case, a storage medium on which the program code is recorded is provided with a system or a device, and a computer (or a CPU and an MPU) of the system or the device reads the program code stored in the storage medium. In this case, the program code itself read from the storage medium achieves the above-described functions of the embodiments, and therefore the program code itself and the storage medium storing it configure the present invention. For example, a flexible disk, a CD-ROM, a DVD-ROM, a hard disk, an optical disk, a magnetic optical disk, a CD-R, a magnetic tape, a non-volatile memory card, a ROM, and he like are used as a storage medium to provide such a program code.

In addition, on the basis of a command from the program code, an OS (operating system) running on a computer or the like may execute a part of or all of the actual processing which achieves the above-described functions of the embodiments.

Moreover, after the program code read from the storage medium is written in the memory on the computer, on the basis of a command from the program code, a CPU or the like of the computer may execute a part of or all of the actual processing which achieves the above-described functions of the embodiments.

In addition, a software program code for achieving the functions of the embodiments is delivered via a network, and thereby the program code may be stored in a storing section such as a hard disk and a memory of a system or a device, or in a storage medium such as a CD-RW and a CD-R, and then when in use, a computer (or a CPU and an MPU) of the system or the device may read out and execute the program code stored in the storing section and the storage medium.

Finally, it is to be appreciated that the process and the technology described herein are not essentially bound to any specific device, and may be implemented by any commensurate combination of components. Furthermore, various types of general-purpose devices can be used in accordance with the teachings described herein. It may be seen that constructing a dedicated device is beneficial in order to execute the steps of the method described herein. In addition, an appropriate combination of multiple components disclosed in the embodiments can make various inventions. For example, some components may be deleted from all the components described in the embodiment. Moreover, components of the different embodiments may be combined as needed. The present invention has been described in association with the specific examples, but they are not for restrictions but for explanations in any way. Those ordinary skilled in the art will appreciate that there are a large number of combinations of hardware, software, and firmware commensurate to perform the present invention. For example, the described software may be implemented by a wide range of program or script languages such as assembler, C/C++, perl, Shell, PHP, Java (registered trademark).

Furthermore, in the above-described embodiments, depicted control lines and information lines are lines considered to be necessary for explanations, but all the control lines and the information lines are not necessarily depicted for the product. All the blocks may be connected to each other.

Additionally, another implementation of the present invention will be apparent to a person skilled in the art by considering the specification and the embodiments of the present invention disclosed herein. In a computed storage system having a function to manage data, a variety of aspects and/or components of the described embodiments may be used in a single portion or any combination of them. The description and the specific examples are only representative, and the scope and the spirit of the present invention will be defined by the following Claims.

REFERENCE SIGNS LIST

101 management server (management computer)
110 allocation rule derivation program
111 equipment position and configuration information
112 facility position and configuration information
113 allocation rule
120 applied rule selection and allocating plan derivation program
121 sensor information
122 system configuration information
123 equipment and facilities operation information
124 allocating plan
130 virtual server controlling program
140 power supply controlling program
150 physical server
160 storage device
170 air conditioner

The invention claimed is:

1. A computer system comprising multiple physical servers for providing a plurality of virtual servers, at least one air conditioning facility, at least one storage device for providing the physical servers with logic volumes, and a management computer, (i) wherein the management computer manages the multiple physical servers and the at least one air conditioning facility which are allocated in a data center and the management computer comprises:

a memory for storing position information of the multiple physical servers and the air conditioning facility in the data center, equipment configuration information on a heat generation amount of each of the multiple physical servers, facility configuration information including air conditioning characteristic information in the at least one air conditioning facility, and environmental state information on a plurality of external air state; and a processor for, on the basis of the position information, the equipment configuration information, and the facility configuration information, creating a vector field showing an air flow in the data center where a heat amount of the multiple physical servers is a predetermined value, for, in accordance with the vector field and the environmental state information on the plurality of external air state, creating a plurality of allocation rules for the plurality of virtual servers in the data center, the allocation rules including information on condition associated with each of the plurality of external air state, in which a power consumption amount of the air conditioning facility is lower than a power consumption amount of a present state, for acquiring environmental information including an external air State, for selecting a first allocation rule including information on first condition associated with the external air state of the acquired environmental information among the plurality of allocation rules, and for presenting an allocation plan of the multiple physical servers based on the first allocation rule, (ii) wherein the multiple physical servers compose a plurality of resource groups and are stored in multiple racks including a first rack, second rack and a virtual server, the first rack includes a first server belonging to a first resource group in bottom spaces of the first rack and includes a second server belonging to a second resource group, the second rack includes a third server belonging to the first resource group and includes a fourth server belonging to the second resource group in bottom space of the second rack, and the virtual server is not movable among the multiple physical servers belonging to the different resource group including the first server and the third server provided that the second server belonging to a second resource group is movable among the multiple physical servers belonging to the same resource group including the fourth server.

2. A computer system according to claim 1, wherein the processor generates the allocation rule by regarding, in the vector field, deployment of the multiple physical servers where air flows around less than deployment of the present state as an allocation pattern in which power consumption of the internal air circulating air conditioner and the external air conditioner is lower than a power consumption amount of the present state.

3. A computer system according to claim 1, wherein the memory includes information on a heat generation amount of the multiple physical servers, and the processor obtains, from sensors installed inside and outside of the server center and the memory, an external air state of the server center, a return air state in the server center, and environmental information including a heat generation amount of the multiple physical servers, and compares the environmental information with the allocation pattern included in the allocation rule to derive and present the allocating plan to be recommended.

4. A computer system according to claim 1, wherein the processor confirms that when there is diffrence between the allocating plan and the present state deployment of the physical servers on which the virtual servers operate, the physical server to be a destination into which the virtual server being indicated by the allocating plan is moved is operating, thereafter controlling the physical server to move the virtual server so as to match the allocating plan.

5. A computer system according to claim 1, wherein the processor confirms that when there is differnce between the allocating plan and the present state deployment of the logic volumes in the at least one storage device, the storage device being indicated by the allocating plan and being a destination to which the logic volume is moved is operating, thereafter controlling the storage device to move the logic volume so as to match the allocating plan.

6. A method for providing an allocating plan of multiple physical servers in a computer system for providing a plurality of virtual servers at least one air conditioning facility at least one storage device for providing the physical servers with logic volumes and, a management computer the method comprising:

(i) the management computer managing the multiple physical servers and the at least one air conditioning facility which are allocated in a data center and wherein the management computer includes:

a memory storing position information of the multiple physical severs and the air conditioning facility in the data center, equipment configuration information on a heat generation amount of each of the multiple physical servers, facility configuration information including air conditioning characteristic information in the at least one air conditioning facility, and environmental state information on a plurality of external air state; and a processor, on the basis of the position information, the equipment configuration information and the facility configuration information, creating a vector field showing an air flow in the data center where a heat amount of the multiple physical servers is a predetermined value, in accordance with the vector field and the environmental state information on the plurality of external air state, the processor creating a plurality of allocation rules for the plurality of virtual servers in the data center, the allocation rules including information on condition associated with each of the plurality of external air state, in which a power consumption amount of the air conditioning facility is lower than a power consumption amount of a present state, the processor acquiring environmental information including information an external air state, the processor selecting a first allocation rule including information on first condition associated with the external air state of the acquired environmental information among the plurality of allocation rules, and the processor presenting an allocation plan of the multiple physical servers based on the first allocation rule, (ii) the multiple physical servers composing a plurality of resource groups and being stored in multiple racks including a first rack, second rack and a virtual server, wherein the first rack including a first server belonging to a first resource group in bottom spaces of the first rack and includes a second server belonging to a second resource group, the second rack including a third server belonging to the first resource group and includes a fourth server belonging to the second resource group in bottom space of the second rack, and, the virtual server is not movable among the multiple physical servers belonging to the different resource group including the first server and the third server provided that the second server belonging to a second resource group is movable among the multiple physical servers belonging to the same resource group including the fourth server.

7. A method according to claim 6, wherein the processor generates the allocation rule by regarding, in the vector field, deployment of the multiple physical servers where air flows around less than deployment of the present state as an allocation pattern in which power consumption of the internal air circulating air conditioner and the external air conditioner is lower than a power consumption amount of the present state.

8. A method according to claim 6, wherein the memory includes information on a heat generation amount of the multiple physical servers, the method further comprising:

the processor obtaining, from sensors installed inside and outside of the server center and the memory, an external air state of the server center, a return air state in the server center, and environmental information including a heat generation amount of the physical servers, and the processor comparing the environmental information with the allocation pattern included in the allocation rule to derive and present the allocating plan to be recommended.

9. A method according to claim 6, the method further comprising:

the processor confirming that when there is difference between the allocating plan and the present state deployment of the physical servers on which the virtual servers operate, the physical server to be a destination into which the virtual server being indicated by the allocating plan is moved is operating, thereafter controlling the physical server to move the virtual server so as to match the allocating plan.

* * * * *